United States Patent
Hayase et al.

(10) Patent No.: US 7,763,795 B2
(45) Date of Patent: Jul. 27, 2010

(54) PHOTOELECTRIC CONVERSION DEVICE AND METHOD FOR MANUFACTURING THE SAME

(75) Inventors: Shuzi Hayase, Kitakyushu (JP); Mitsuru Kono, Kitakyushu (JP); Koichi Yamashita, Kitakyushu (JP); Yoshihiro Yamaguchi, Kitakyushu (JP)

(73) Assignee: National University Corporation Kyushu Institute of Technology, Kitakyushu-shi (JP)

( * ) Notice: Subject to any disclaimer, the term of this patent is extended or adjusted under 35 U.S.C. 154(b) by 205 days.

(21) Appl. No.: 11/885,364

(22) PCT Filed: Feb. 28, 2006

(86) PCT No.: PCT/JP2006/303670

§ 371 (c)(1), (2), (4) Date: Dec. 28, 2007

(87) PCT Pub. No.: WO2006/093109

PCT Pub. Date: Sep. 8, 2006

(65) Prior Publication Data

US 2008/0210297 A1 Sep. 4, 2008

(30) Foreign Application Priority Data

Mar. 3, 2005 (JP) ............................. 2005-058583
Sep. 2, 2005 (JP) ............................. 2005-254606

(51) Int. Cl.
  *H01L 21/00* (2006.01)
  *H01L 31/00* (2006.01)
(52) U.S. Cl. ...................... 136/263; 136/252; 438/57
(58) Field of Classification Search ................ 136/252, 136/263; 438/57
See application file for complete search history.

(56) References Cited

U.S. PATENT DOCUMENTS 6,194,650 B1    2/2001   Wakayama et al.

(Continued)

FOREIGN PATENT DOCUMENTS

JP    2000-21460 A    1/2000
JP    2000-21461 A    1/2000

(Continued)

OTHER PUBLICATIONS

Sakaguchi, et al. "Dye adsorption and block molecule adsorption and characteristics of resulting dye sensitized solar cells," Nippon Kagak-kai Koen Yokoshu, v. 85, 1, 2005.*

(Continued)

*Primary Examiner*—Jeffrey T Barton
*Assistant Examiner*—Allison Bourke
(74) *Attorney, Agent, or Firm*—Birch, Stewart, Kolasch & Birch, LLP

(57) ABSTRACT

Disclosed are a method for effectively preventing the contact between the surface of a titanium oxide semiconductor electrode and an electrolyte solution, a photoelectric conversion device exhibiting high photoelectric conversion efficiency, and a dye-sensitized solar cell using the said photoelectric conversion device. The photoelectric conversion device comprising a dye-sensitized semiconductor electrode is manufactured by letting a semiconductor adsorb a sensitizing dye, then rinsing the dye-adsorbed semiconductor, and finally letting the rinsed dye-adsorbed semiconductor adsorb a carboxylic acid in supercritical carbon dioxide. The adsorption of a dye and the rinsing are performed preferably in supercritical carbon dioxide in the presence or absence of an alcohol of 1-4 carbon atoms.

4 Claims, 1 Drawing Sheet

U.S. PATENT DOCUMENTS

2003/0062082 A1* 4/2003 Miteva et al. .............. 136/263

FOREIGN PATENT DOCUMENTS

| JP | 2000-21462 A | 1/2000 |
|---|---|---|
| JP | 2001-223037 A | 8/2001 |
| JP | 2003-234133 A | 8/2003 |

OTHER PUBLICATIONS

Translation of Sakaguchi, et al. "Dye adsorption and block molecule adsorption and characteristics of resulting dye sensitized solar cells," Nippon Kagakkai Koen Yokoshu, v. 85, 1, 2005. Translation done by FLS, Inc., Sep. 2009.*

* cited by examiner

PHOTOELECTRIC CONVERSION DEVICE AND METHOD FOR MANUFACTURING THE SAME

FIELD OF TECHNOLOGY

This invention relates to a photoelectric conversion device comprising a metal oxide semiconductor electrode and a dye for light absorption adsorbed thereon and to a dye-sensitized solar cell in which the said photoelectric conversion device is incorporated.

TECHNICAL BACKGROUND

Solar cells comprising monocrystalline, polycrystalline, or amorphous silicon semiconductors are currently used in electrical appliances such as handheld calculators and in household solar power generation. However, the manufacture of silicon solar cells employs processes requiring a high degree of accuracy such as plasma CVD and high-temperature crystal growth. These processes not only consume a large quantity of energy but also need a costly equipment involving generation of vacuum and, as a result, incur an increase in production cost.

Now, a dye-sensitized solar cell comprising an oxide semiconductor such as titanium oxide on which a sensitizing dye such as a ruthenium metal complex is adsorbed has been proposed as a solar cell that can be manufactured at low cost. A concrete example of such dye-sensitized solar cell comprises a negative electrode which consists of a top layer of titanium oxide semiconductor on which a ruthenium complex dye is adsorbed, a middle layer of transparent conductive indium-tin oxide, and a bottom layer of transparent insulating material such as a transparent glass or plastic plate, a positive electrode which consists of a layer of metal such as platinum or a layer of conductor formed on a transparent insulating material such as a transparent glass or plastic plate, and an electrolyte solution which is sealed between the two electrodes. When light falls on the dye-sensitized solar cell, absorption of light by the dye excites the electrons of the dye, the excited electrons move to the semiconductive layer and then to the transparent electrode at the negative electrode while the electrons coming from the conductive layer reduce the electrolyte at the positive electrode. The reduced electrolyte is oxidized by transferring the electrons to the dye and this cycle is considered to account for power generation by a dye-sensitized solar cell.

At the present time, a dye-sensitized solar cell shows a lower efficiency in converting incident light energy to electrical energy than a silicon solar cell and improvement of this conversion efficiency presents an important problem to solve in realizing practicable manufacture of a dye-sensitized solar cell. The efficiency of a dye-sensitized solar cell appears to be influenced by the characteristics of individual constituent elements and also by a combination of such elements and a variety of approaches have been tried to improve the efficiency. In particular, attention is given to the interaction between a sensitizing dye and titanium oxide functioning as a semiconductive layer and to the technique for preventing the electrons that have once been injected into titanium oxide from flowing back to the electrolyte solution.

The following documents are known prior to this invention.

Patent document 1: JP2001-223037 A
Patent document 2: JP7-500630 A1
Patent document 3: JP10-504521 A1
Patent document 4: JP2002-512729 A1
Patent document 5: JP2003-234133 A
Patent document 6: JP2000-228233 A
Patent document 7: JP2004-227920 A
Non-patent document 1: Chemistry Letters, 853, 1999
Non-patent document 2: Photochem. and Photobio. A, Chem. 164 (2004) 117

The non-patent document 1 describes a method for improving the fill factor of a dye-sensitized solar cell by dissolving the organic dye Eosin Y in methanol as an entrainer and letting a titanium oxide semiconductor electrode adsorb the dye in supercritical carbon dioxide at a pressure of 25 Mpa and a temperature of 493 K. The patent document 1 describes adsorption of a dye on a semiconductor in a supercritical fluid and the supercritical conditions used there are a pressure of approximately 8 Mpa and a temperature of 40° C. The patent document 5 also describes adsorption effected in a supercritical fluid. The non-patent document 2 and patent document 7 describe the possibility of sharply increasing the short-circuit current density of a dye-sensitized solar cell by adsorbing acetic acid on titanium oxide after adsorption of the dye.

The patent document 6 describes a method for adsorbing a dye and further describes a rinsing operation. However, it does not disclose a carboxylic acid treatment after the rinsing.

DISCLOSURE OF THE INVENTION

Problems to be Solved by the Invention

However, none of the aforementioned methods sufficiently improves the photoelectric conversion efficiency. Under the circumstances, this invention aims at optimizing the adsorption of a dye on the surface of a semiconductor electrode, preventing the surface of the semiconductor from contacting an electrolyte solution, and obtaining a highly efficient photoelectric conversion device or a dye-sensitized solar cell fabricated therefrom.

Means to Solve the Problems

This invention relates to a photoelectric conversion device which comprises a dye-sensitized semiconductor electrode that is obtained by adsorbing a sensitizing dye on a semiconductor, rinsing the dye-adsorbed semiconductor, and further adsorbing a carboxylic acid on the rinsed dye-adsorbed semiconductor in supercritical carbon dioxide.

Further, this invention relates to a method for manufacturing a photoelectric conversion device containing a dye-sensitized semiconductor electrode, the said method comprising adsorbing a sensitizing dye on a semiconductor, rinsing the dye-adsorbed semiconductor, and adsorbing a carboxylic acid on the rinsed dye-adsorbed semiconductor in supercritical carbon dioxide. Still further, this invention relates to a dye-sensitized solar cell fabricated from the aforementioned photoelectric conversion device.

EXPLANATION OF SYMBOLS

1 Substrate; 2 transparent conductive film; 3 dye-adsorbed metal oxide layer; 4 substrate; 5 conductive film; 6 electrolyte solution; 7 spacer; 10 surface electrode; 11 counter electrode; 21 pressure vessel; 22 laminate; 23 solution to be treated; 24 laminate holder; 25 stirrer; 26 pressure control valve.

PREFERRED EMBODIMENTS OF THE INVENTION

Figure 1:
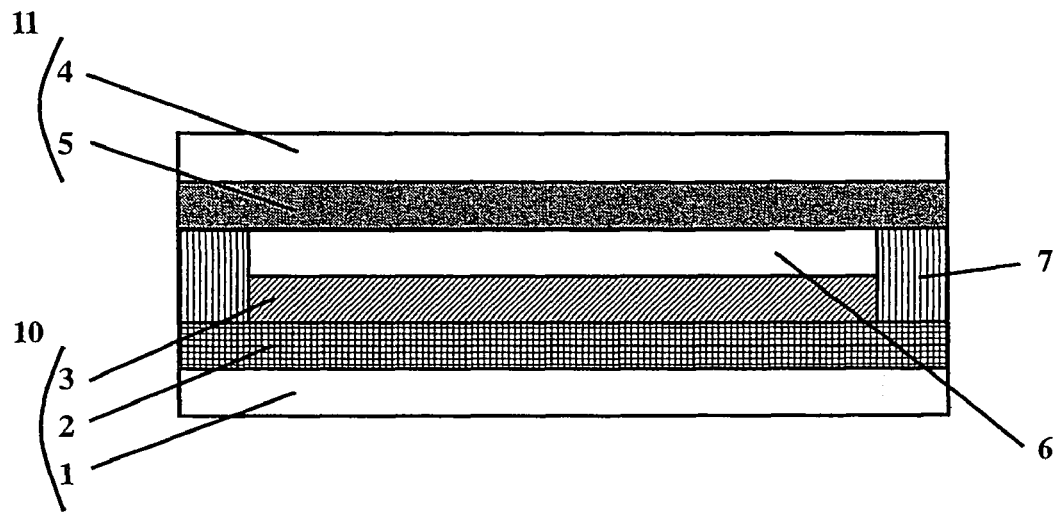
FIG. 1 shows the cross section of a photoelectric conversion device relating to this invention.

This invention is described with reference to FIG. 1 illustrating the basic composition of a photoelectric conversion device. FIG. 1 shows the cross section of an example of dye-sensitized solar cell and the device comprises a surface electrode 10 that is constructed by stacking a conductive layer 2 and a dye-adsorbed semiconductive layer 3 one upon another in this order on a substrate 1, a counter electrode 11 that has a conductive layer 5 on a substrate 4, and an electrolyte solution 6 arranged between the two electrodes. The dye-adsorbed semiconductor layer 3 is also called a semiconductor electrode as it constitutes a part of the electrode. The dye-adsorbed semiconductor layer 3 comprises particles of a metal oxide such as titanium oxide and a sensitizing dye covering the surface of these particles. Light enters the device from the side of the surface electrode 10. A dye-sensitized solar cell to be provided by this invention has a basic composition similar to that of the aforementioned photoelectric conversion device, although it is made to work in the external circuit. A know method is used to fabricate a dye-sensitized solar cell from the photoelectric conversion device.

The material useful for the substrate 1 is not limited to any specific one as long as it is a transparent insulating material. For example, it is an ordinary glass or plastic plate and it may additionally be a flexible material such as PET resin. However, the material is preferably sufficiently heat-resistant to withstand the step for calcining titanium oxide, the maximum temperature there being approximately 500° C., and a transparent glass plate is preferred in this respect.

The conductive layer 2 that does not harm the transparency is then provided on the surface of the substrate 1. The so-called transparent electrodes such as ITO, FTO, and ATO are used, either singly or combined, or a layer of metal with such a thickness as not to harm the transparency may be used. The method for providing this conductive layer is not limited and the known techniques useful for this purpose include sputtering, vapor deposition (including CVD and PVD), spraying, and laser ablation and, moreover, spin coating, bar coating, and screen printing of the paste of respective material. However, a suitable method is spraying, vapor-phase sputtering, or vapor deposition.

The dye-adsorbed semiconductor layer 3 is provided on the conductive layer. Normally, a layer of a semiconductor is first formed from a metal oxide and a sensitizing dye is adsorbed on it. Any of the metal oxides known as photoelectric conversion materials such as titanium oxide, zinc oxide, and tungsten oxide can be used here and preferable among them is titanium oxide, available as oxides such as anatase, rutile, and brookite, hydroxides, or hydrous oxides. It is allowable to dope titanium oxide with at least one of Nb, V, and Ta to a concentration by weight (as metal) of 30 ppm to 5%. The aforementioned metal oxides are suitable for use in this invention and they are preferably in the form of fine particles with an average diameter in the range of 5 to 500 nm, preferable 10 to 200 nm.

A layer of metal oxide is formed on the aforementioned transparent electrode 2 and the method therefor is not limited; for example, a metal oxide is converted into a paste and then applied by a technique such as spin coating, printing, and spray coating. Moreover, it is possible to calcine the resulting metal oxide film to effect sintering of the metal oxide. Following this, a dye is adsorbed on the metal oxide to form the dye-adsorbed semiconductor layer 3. It is also possible to form the dye-adsorbed semiconductor layer 3 by adsorbing the dye on the metal oxide, converting the dye-adsorbed metal oxide into a paste, and applying the paste to the transparent electrode 2.

The dye-adsorbed semiconductor layer 3 constitutes the essential feature of this invention; other layers may have a known structure or may be made from a known material and do not necessarily have the structure shown in FIG. 1. The constituents of the dye-adsorbed semiconductor layer 3 are a semiconductor and a dye. Since the semiconductor used here is normally a metal oxide, preferably titanium oxide, the semiconductor is often represented by a metal oxide or titanium oxide. The sensitizing dyes are not limited and may be chosen from metal complex dyes, organic dyes, phthalocyanine dyes, porphyrin dyes, methine dyes, and others and they are used either singly or as a mixture. Metal complex dyes are preferable and ruthenium complex dyes are more preferable.

Of the ruthenium complex dyes described in the patent documents 1 to 4 and in the relevant documents cited in the patent document 1 (for example, U.S. Pat. No. 4,927,721), those which are soluble in solvents may be used in this invention; for example, cis-L2-bis(2,2'-bipyridyl-4,4'-dicarboxylate)ruthenium(II) complex (L denoting a halogen, CN, or SCN), cis-L2-bis(2,2'-bipyridyl-4,4'-dicarboxylate)ruthenium(II)-bis-tetrabutylammonium, and tris-L2-ruthenium (II)-2,2',6',2''-terpyridine-4,4',4''-tricarboxylic acid-tris-tetrabutylammonium salt.

According to this invention, the selected dye is adsorbed on a metal oxide semiconductor such as titanium oxide, the dye-adsorbed semiconductor is rinsed, and a carboxylic acid is adsorbed on the rinsed semiconductor in supercritical carbon dioxide. For example, a dye is adsorbed on a metal oxide semiconductor by the impregnation method, that is, a dye is dissolved in a suitable solvent and a unit formed by stacking a metal oxide layer, the conductive film 2, and the substrate 1 one upon another is immersed in the dye solution. With application of the impregnation method, however, it sometimes happens that the dye is not adsorbed efficiently in the micropores of a metal oxide such as titanium oxide due to the influence of the surface tension of the dye solution and, as a result, the dye molecules fail to cover the surface of titanium oxide completely. Thus, the impregnation method encounters a problem such as generation of reverse current with the resultant drop in the photoelectric conversion efficiency of a dye-sensitized solar cell due to insufficient adsorption of the dye and direct contact of the exposed surface of titanium oxide with the electrolyte solution.

Figure 2:
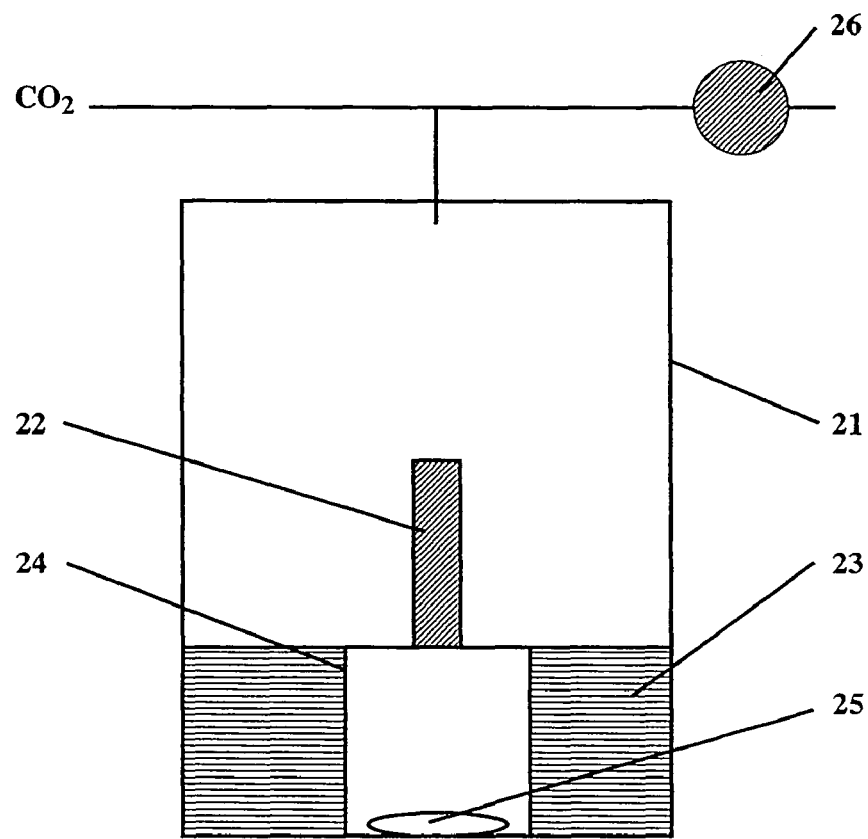
FIG. 2 is a schematic drawing of an apparatus for experiments under supercritical conditions.

According to this invention, a dye is preferably adsorbed on a metal oxide in supercritical carbon dioxide. This is effected by impregnating a substrate bearing a conductive layer and a metal oxide layer with supercritical carbon dioxide containing a dye. FIG. 2 illustrates schematically a pressure apparatus for effecting adsorption wherein a substrate 22 bearing a conductive layer and a metal oxide layer is fixed on a holder 24 in a vessel 21. A solution 23 of a dye is placed in the vessel 21 and is agitated by a stirrer 25. Carbon dioxide is introduced to the vessel and the pressure is maintained at a prescribed level by a pressure control valve 26. Supercritical carbon dioxide is mixed with the solution 23 and the resulting mixture comes into contact with the substrate 22 to effect impregnation.

The aforementioned procedure produces good results when the dye is dissolved in an alcoholic solvent containing at least one kind of methanol, ethanol, propanol, and butanol and adsorption of the dye is allowed to proceed in supercritical carbon dioxide formed at a pressure in the range of 10 to 25 MPa and a temperature in the range of 40 to 60° C. Moreover, it is preferable to effect adsorption by continuously raising and lowering the pressure between the atmospheric pressure and the one in the aforementioned pressure range.

The concentration of the dye in the alcohol is not limited, but it is preferably in the range of $1 \times 10^{-4}$ mol/L to $3 \times 10^{-3}$ mol/L. Supercritical carbon dioxide is known to show an extremely small surface tension and it is likely that, when adsorption of the dye is effected in a supercritical fluid, the dye effectively enters the micropores of a metal oxide such as titanium oxide.

According to this invention, the aforementioned dye-adsorbed metal oxide semiconductor is rinsed. Rinsing is performed, for example, by immersing the metal oxide after adsorption of the dye in an alcohol such as methanol and ethanol to wash off the dye adhering to the metal oxide in excess. The reason for rinsing is washing off of the excess dye to prevent lowering of the photoelectric conversion efficiency; in the case where excess dye molecules are allowed to adsorb on the initially adsorbed dye molecules, it appears likely; although not understood clearly, that those excess dye molecules that are not in contact with the metal oxide such as titanium oxide not only do not participate in the generation of electric current but also absorb the incident light thereby lowering the photoelectric conversion efficiency.

In effecting adsorption of the dye in a supercritical fluid, it has been found that rinsing with supercritical carbon dioxide is preferable. This finding seems to stress the particular importance of washing off the excess dye from the micropores of titanium oxide or other metal oxides. This rinsing with supercritical carbon dioxide is performed effectively by placing dye-adsorbed titanium oxide in supercritical carbon dioxide or, more preferably, placing dye-adsorbed titanium oxide or its laminate with the substrate in supercritical carbon dioxide containing at least one kind of alcohol selected from methanol, ethanol, propanol, and butanol. The aforementioned pressure apparatus can be used for this rinsing operation.

The conditions for rinsing with supercritical carbon dioxide are not limited and any conditions suitable for forming supercritical carbon dioxide can be used; however, it is preferable to set a pressure in the range of 10 to 25 Mpa and a temperature in the range of 40 to 60° C. The rinsing conditions are set in such a manner as to wash out only a part of the adsorbed dye (that is, excess dye).

After completion of rinsing, a carboxylic acid is adsorbed on the dye-adsorbed metal oxide in supercritical carbon dioxide. The effect produced by the adsorption of a carboxylic acid is publicly known from the aforementioned non-patent document 2 and patent document 7. However, as in the case of the adsorption and rinsing of the dye, it is important to allow the carboxylic acid to be adsorbed effectively in the micropores of titanium oxide and other metal oxides. It has been found that effective adsorption can be attained by placing a dye-adsorbed metal oxide (or a substrate bearing a layer of dye-adsorbed metal oxide) and a carboxylic acid in supercritical carbon dioxide formed at a pressure in the range of 8 to 30 Mpa and a temperature in the range of 40 to 60° C. The carboxylic acids useful for this purpose include benzoic acid, acetic acid, anisic acid, nicotinic acid, propionic acid, butyric acid, o-bromobenzoic acid, m-bromobenzoic acid, p-bromobenzoic acid, 3-bromopropionic acid, α-bromo-p-toluic acid, 4-(bromomethyl)benzoic acid, o-chlorobenzoic acid, m-chlorobenzoic acid, p-chlorobenzoic acid, o-iodobenzoic acid, m-iodobenzoic acid, p-iodobenzoic acid, 4-bromoisophthalic acid, 2-(trimethylsilyl)acetic acid, and 2-thiophenecarboxylic acid, but they are not limited to these examples cited. In particular, acetic acid, propionic acid, and butyric acid are preferred for their small molecular size and ease of adsorption on the surface of titanium oxide. These carboxylic acids are preferably used in the form of a solution in an alcohol containing at least one kind selected from methanol, ethanol, propanol, and butanol at a concentration in the range of 0.01 to 10 mol/L.

The surface electrode 10 comprising the substrate 1, the transparent conductive film 2, and the dye-adsorbed semiconductor layer 3 acts as a negative electrode. The electrode 11 (counter electrode) acting as a positive electrode is arranged opposite the surface electrode 10 as shown in FIG. 1. The positive electrode here is constructed of a conductive metal or of the substrates made of an ordinary glass plate or plastic plate to which a conductive film 5 of metal or carbon is attached.

An electrolyte layer is provided between the surface electrode 10 acting as a negative electrode and the counter electrode 11 acting as a positive electrode. This electrolyte layer is not limited to any specific kind provided the electrolyte in question contains a redox species capable of reducing the dye that has completed injection of electrons to the photoexcited semiconductor and it may be in the form of a solution or of a gel formed by addition of a known gelling agent of either high or low molecular weight.

The electrolytes suitable for use in the electrolyte solution include a combination of iodine and an iodide (a metal iodide such as LiI, NaI, KI, CsI, and $CaI_2$ or a quaternary ammonium iodide such as tetraalkylammonium iodide, pyridinium iodide, and imidazolium iodide), a combination of bromine and a bromide (a metal bromide such as LiBr, NaBr, KBr, CsBr, and $CaBr_2$ or a quaternary ammonium bromide such as tetraalkylammonium bromide and pyridinium bromide), sulfur compounds such as polysodium sulfide, alkylthiols, and alkyl disulfides, biologen dye, hydroquinones, and quinones. These electrolytes may be used as a mixture.

Furthermore, the electrolyte desirably comprises a high-boiling molten salt. In the case where the semiconductor electrode comprises a dye-adsorbed titanium oxide layer, a combination of this semiconductor electrode with a molten salt electrolyte manifests particularly excellent cell characteristics. A composition containing a molten salt electrolyte is preferably liquid at room temperature. The molten salt constituting the main component of the composition is a liquid or low-melting electrolyte at room temperature and its typical examples are pyridinium salts, imidazolium salts, and triazolium salts described in "Electrochemistry," Vol. 65, No. 11, p. 923 (1997) and elsewhere. The molten salts may be used singly or as a mixture of two kinds or more. Furthermore, it is possible to use the molten salt together with an alkali metal salt such as LiI, NaI, KI, $LiBF_4$, $CF_3COOLi$, $CF_3COONa$, LiSCN, and NaSCN. Normally, a molten salt electrolyte composition contains iodine. It is preferable that the composition shows low volatility and contains no solvent. It is allowable to use the composition after conversion to a gel.

In the case where a solvent-based electrolyte is used, the candidate solvent desirably shows low viscosity, high ionic mobility, and excellent ionic conductivity. Such solvents include carbonates such as ethylene carbonate and propylene carbonate, heterocyclic compounds such as 3-methyl-2-oxazolidinone, ethers such as dioxane and diethyl ether, linear ethers such as ethylene glycol dialkyl ethers, propylene glycol dialkyl ethers, polyethylene glycol dialkyl ethers, and polypropylene glycol dialkyl ethers, alcohols such as methanol, ethanol, ethylene glycol monoalkyl ethers, polypropylene glycol monoalkyl ethers, polyethylene glycol monoalkyl ethers, and polypropylene glycol monoalkyl ethers, polyhydric alcohols such as ethylene glycol, propylene glycol, polyethylene glycol, polypropylene glycol, and glycerin, nitriles such as acetonitrile, glutarodinitrile, methoxyacetonitrile, propionitrile, and benzonitrile, and aprotic polar substances such as dimethyl sulfoxide and sulfolane, and water. These solvents may be used as a mixture.

The method for providing an electrolyte layer is not limited. For example, the spacers 7 are arranged between the two electrodes to form a gap and an electrolyte is injected into the gap or an electrolyte is applied to the negative electrode by coating and the positive electrode is put in place at suitable interval. It is desirable to seal the two electrodes and their surroundings to prevent the electrolyte from flowing out and the method and materials for sealing are not limited.

EXAMPLES

This invention will be described in detail below with reference to the examples and comparative examples.

Examples 1-2

A glass plate bearing a film of FTO (tin oxide doped with fluorine) or Low-E Glass (tradename of Nippon Sheet Glass Co., Ltd.) was used as a glass substrate, 30×25×3 mm, bearing a transparent conductive film.

A film of titanium oxide was formed on the substrate bearing the conductive film. A commercially available titanium oxide paste (D Paste, available from Solaronix SA) was applied to the conductive film on the substrate to an area of 20×5 mm with the aid of a squeegee. The paste was dried and then calcined at 450° C. to give a laminate on which a 15 μm-thick layer of titanium oxide was formed.

A commercially available ruthenium complex dye (Solaronix N3) was dissolved in ethanol to a concentration of $3 \times 10^{-4}$ mol/L. Adsorption of the dye was effected by the impregnation method or by the use of supercritical carbon dioxide. With application of the impregnation method, the aforementioned laminate was immersed in the dye solution at room temperature for 24 hours to give the dye-adsorbed laminate. With the use of supercritical carbon dioxide, the dye solution was placed in a pressure vessel shown in FIG. 2 (an apparatus available from JASCO Corporation), the aforementioned laminate bearing a titanium oxide layer was put in place, and the vessel was purged with carbon dioxide gas. The temperature and pressure of the vessel were controlled at prescribed values to form supercritical carbon dioxide and the dye solution was maintained there for 30 minutes with stirring. The carbon dioxide gas was vented to return the pressure to atmospheric and the dye-adsorbed laminate was taken out of the pressure vessel.

The rinsing operation was then performed by the impregnation method or by the use of supercritical carbon dioxide. With application of the impregnation method, the dye-adsorbed laminate was immersed several times in ethanol. With the use of supercritical carbon dioxide, the dye-adsorbed laminate was arranged in the aforementioned pressure vessel, ethanol was introduced to such an extent as not to immerse the laminate, the vessel was purged with carbon dioxide gas as above, the temperature and pressure were controlled at prescribed values to form supercritical carbon dioxide, and the laminate was maintained there for 30 minutes with stirring. The carbon dioxide gas was vented to return the pressure to atmospheric and the rinsed laminate was taken out of the pressure vessel.

Then, the rinsed laminate was arranged in the aforementioned pressure vessel and ethanol containing 1 wt % acetic acid was introduced to such an extent as not to immerse the laminate. The vessel was purged with carbon dioxide gas as above, the temperature and pressure were controlled at prescribed values to form supercritical carbon dioxide, and the laminate was maintained there for 30 minutes with stirring to effect adsorption of the acetic acid. The carbon dioxide gas was vented to return the pressure to atmospheric and the acid-treated laminate was taken out of the pressure vessel.

A 50 μm-thick thermoplastic adhesive sheet made of an ionomer (Himilan sheet, available from DuPont-Mitsui Polychemicals Co., Ltd.) was pasted on the laminate along the four sides of the titanium oxide film, 20×5 mm in area, while providing two gaps, approximately 1 mm each, in the periphery for injection of an electrolyte. This thermoplastic adhesive plays dual roles of a sealant and a spacer. A glass substrate on which a 10 nm-thick platinum film had been formed by sputtering was pasted on the aforementioned thermoplastic adhesive so that the platinum film as a positive electrode is placed opposite the laminate with the platinum facing the titanium oxide. An acetonitrile solution containing 0.5 M LiI, 0.5 M t-butylpyridine, and 0.05 M iodine as main components was introduced through the gaps provided in the thermoplastic adhesive sheet to fill the space between the laminate and the positive electrode by the capillary action. The gaps were sealed with an epoxy resin adhesive immediately after filling of the electrolyte and a photoelectric conversion device was obtained.

Examples 3-4

The experiments were performed as in Examples 1-2 with the exception of using a commercially available ruthenium complex dye (Solaronix N719) in place of Solaronix N3.

Example 5

The experiment was performed as in Example 2 with the exception of using a commercially available ruthenium complex dye (Solaronix Black Dye) in place of Solaronix N3.

Comparative Example 1

A laminate bearing a titanium oxide layer was prepared under the same conditions as in Example 1.

A ruthenium complex dye (Solaronix N3) was dissolved in ethanol to a concentration of $3 \times 10^{-4}$ mol/L and the laminate was immersed in the dye solution at room temperature for 24 hours to effect adsorption of the dye on the laminate. The dye-adsorbed laminate was rinsed several times by immersion in ethanol, the rinsed laminate was immersed in a 1 wt % solution of acetic acid in ethanol at room temperature for 5 minutes, and thereafter immersed several times in ethanol to give an acid-treated laminate. The steps after this were the same as in the examples and a photoelectric conversion device was obtained.

Comparative Example 2

The experiment was performed as in Comparative Example 1 with the exception of using Solaronix N719 in place of Solaronix N3.

Comparative Example 3

The experiment was performed as in Comparative Example 1 with the exception of using Solaronix Black Dye in place of Solaronix N3.

The cell characteristics of the solar cells fabricated from the photoelectric conversion devices prepared in examples and comparative examples were evaluated under AM 1.5 simulated solar irradiation. The results are shown in Table 1. The conditions for adsorption of dye, rinsing, and carboxylic acid treatment are also shown in Table 1. It is to be noted that supercritical carbon dioxide is not used where the $CO_2$ pressure is not indicated in the table.

TABLE 1

| | Dye | Adsorption of dye Temperature: $CO_2$ pressure | Rinsing Temperature: $CO_2$ pressure | Treatment with carboxylic acid Temperature: $CO_2$ pressure | Relative conversion efficiency |
|---|---|---|---|---|---|
| Example 1 | N3 | Impregnation method | Immersion in ethanol | 50° C.: 25 Mpa | 1.13 |
| 2 | N3 | 50° C.: 23 Mpa | 50° C.: 23 Mpa | 50° C.: 25 Mpa | 1.20 |
| 3 | N719 | Impregnation method | Immersion in ethanol | 50° C.: 25 Mpa | 1.30 |
| 4 | N719 | 50° C.: 23 Mpa | 50° C.: 23 Mpa | 50° C.: 25 Mpa | 1.38 |
| 5 | BlackDye | 50° C.: 23 Mpa | 50° C.: 23 Mpa | 50° C.: 25 Mpa | 1.00 |
| Comparative example 1 | N3 | Impregnation method | Immersion in ethanol | Immersion in acetic acid solution | 1 |
| 2 | N719 | Impregnation method | Immersion in ethanol | Immersion in acetic acid solution | 1.15 |
| 3 | BlackDye | Impregnation method | Immersion in ethanol | Immersion in acetic acid solution | 0.4 |

INDUSTRIAL APPLICABILITY

A photoelectric conversion device manufactured according to this invention or a dye-sensitized solar cell constituted thereof shows high photoelectric conversion efficiency.

What is claimed is:

1. A method for manufacturing a photoelectric conversion device having a dye-sensitized semiconductor electrode which comprises adsorbing a sensitizing dye on a semiconductor, rinsing the dye-adsorbed semiconductor, and adsorbing a carboxylic acid on the rinsed dye-adsorbed semiconductor in supercritical carbon dioxide.

2. A method for manufacturing a photoelectric conversion device as described in claim 1 wherein the adsorption of the carboxylic acid is effected in supercritical carbon dioxide at a pressure of 8-30 Mpa and a temperature of 40-60° C.

3. A method for manufacturing a photoelectric conversion device as described in claim 1 or 2 wherein the adsorption of the sensitizing dye is performed in supercritical carbon dioxide and the rinsing is performed in supercritical carbon dioxide.

4. A method for manufacturing a photoelectric conversion device as described in claim 1 or 2 wherein the sensitizing dye is dissolved in an alcohol of 1-4 carbon atoms, adsorbed on a semiconductor in supercritical carbon dioxide at a pressure of 10-25 Mpa and a temperature of 40-60° C., and rinsed in supercritical carbon dioxide or in supercritical carbon dioxide containing an alcohol of 1-4 carbon atoms.

* * * * *